(12) United States Patent
Yoon et al.

(10) Patent No.: US 6,721,220 B2
(45) Date of Patent: Apr. 13, 2004

(54) BIT LINE CONTROL AND SENSE AMPLIFICATION FOR TCCT-BASED MEMORY CELLS

(75) Inventors: Sei-Seung Yoon, Cupertino, CA (US); Seong-Ook Jung, Cupertino, CA (US)

(73) Assignee: T-RAM, Inc., San Jose, CA (US)

( * ) Notice: Subject to any disclaimer, the term of this patent is extended or adjusted under 35 U.S.C. 154(b) by 0 days.

(21) Appl. No.: 10/191,686

(22) Filed: Jul. 5, 2002

(65) Prior Publication Data

US 2004/0004880 A1 Jan. 8, 2004

(51) Int. Cl.[7] .................................................. G11C 7/00
(52) U.S. Cl. ........................................ 365/205; 365/190
(58) Field of Search .................................. 365/205, 190

(56) References Cited

U.S. PATENT DOCUMENTS

| | | | | |
|---|---|---|---|---|
| 5,274,598 A | * | 12/1993 | Fujii et al. | ................ 365/205 |
| 5,448,516 A | * | 9/1995 | Tsukikawa et al. | ......... 365/182 |
| 5,561,630 A | * | 10/1996 | Katoh et al. | ............ 365/189.01 |
| 6,229,161 B1 | | 5/2001 | Nemati et al. | ............... 257/133 |

OTHER PUBLICATIONS

Barth, Anand, Dreibelbis, Nelson; "A 300 MHz Multi–Banked eDRAM Macro Featuring GND Sense, Bit–line Twisting and Direct Reference Cell Write," 2002 IEEE International Solid–State Circuits Conference.

Kang, Kye, Lee, Park, Kim, Lee, Hong, Park, Chung; "A Hierarchy Bitline Boost Scheme forSub–1.5V Operation and Short Precharge Time on High Density FeRAM," 2002 IEEE International Solid–State Circuits Conference.

Nishihara, Ito; "A Quasi–Matrix Ferroelectric Memory for Future Silicon Storage," 2002 IEEE International Solid–State Circuits Conference.

Choi, Geon, Jang, Min, Song, Lee, Kim, Jung, Joo, Kim; "A 0.25 um 3.0v 1T1C 32Mb Nonvolatile Ferroelectric RAM with Address Transition Detector (ATD) and Current Forcing Latch Sense Amplifier (CFLSA) Scheme," 2002 IEEE International Solid–State Conference.

\* cited by examiner

*Primary Examiner*—Michael Tran

(57) ABSTRACT

A circuit and a method are provided for facilitating control of bit lines in preparation for, or during, sense amplification of data signals from thinly capacitively-coupled thyristor ("TCCT")-based memory cells. In accordance with a specific embodiment, a circuit and method are designed, among other things, to effectively minimize power consumption by memory cells and to increase speed and reliability of sense amplification. In another specific embodiment, the circuit and method are directed to TCCT-based memory cells.

53 Claims, 9 Drawing Sheets

BIT LINE CONTROL AND SENSE AMPLIFICATION FOR TCCT-BASED MEMORY CELLS

BACKGROUND OF THE INVENTION

1. Field of the Invention

The present invention relates generally to integrated circuits, and in particular, to a circuit and a method for facilitating the control of bit lines in preparation for, or during, sense amplification of data signals from thinly capacitively-coupled thyristor ("TCCT")-based memory cells.

2. Description of Related Art

Random Access Memories ("RAM") are memories capable of multiple read-write cycles and are widely used to temporally store data in computing applications. A typical RAM is structured to include numerous memory cells arranged in an array of rows and columns wherein each memory cell is designed to store a datum or unit of data as a binary digit (i.e., a binary zero or a binary one). Each row of the memory cell array is typically connected to a word line and each column of the memory cell array is typically connected to a bit line (or a pair of complementary bit lines in some memories, such as an SRAM-based memory). The typical RAM structure also includes other circuitry to effect traditional read and write operations, such as reference signal generation circuitry, control signal circuitry, and sensing circuitry.

A constituent memory cell for a RAM is disclosed in U.S. Pat. No. 6,229,161 issued to Nemati et al., which is incorporated herein by reference in its entirety. Netmati et al. discloses capacitively coupled NDR devices for use as SRAM memory cells (also referred herein as TRAM cells). The cells disclosed by Nemati et al. are hereinafter referred to as thinly capacitively coupled thyristor ("TCCT")-based memory cells wherein the NDR device is a TCCT device. FIG. 1 shows a pair of representative TCCT-based memory cells 10 as disclosed by Nemati et al., and FIG. 2 shows a cross-section through one of the pairs of TCCT-based memory cell 10 along the line 2—2. FIG. 3 shows a schematic circuit diagram corresponding to the TCCT-based memory cell illustrated in FIGS. 1 and 2. The TCCT-based memory cell 10 includes an NDR device 12 and a pass transistor 14. A charge-plate or gate-like device 16 is disposed adjacent to, and in the case of the illustrated embodiment, surrounding, the NDR device 12. A P+ region 18 of the NDR device 12 is connected to a metallization layer 20 so that a first voltage $V_1$, such as $V_{DDA}$, can be applied to the NDR device 12 through the P+ region 18. An N+ region of the NDR device 12 forms a storage node 22 that is connected to a source of the pass transistor 14.

Successive TCCT-based memory cells 10 are joined by three lines, a bit line 26, a first word line (WL1) 28, and a second word line (WL2) 30. The bit line 26 connects a drain 32 of pass transistor 14 to successive TCCT-based memory cells 10. In a similar fashion, pass transistor 14 includes a gate 34 that forms a portion of the first word line 28. Likewise, the gate-like device 16 forms a portion of the second word line 30.

TCCT-based memory cell 10 has both an "on" state and an "off" state. In the "on" state TCCT-based memory cell 10 generates a current that is received by bit line 26. In the "off" state TCCT-based memory cell 10 produces essentially no current. Second word line 30 is configured to write a state to the TCCT-based memory cell 10, while first word line 28 is generally configured to read the state of the TCCT-based memory cell 10.

An inherent characteristic of TCCT-based memory cell 10 is that the NDR device 12 can develop a leakage current ("$I_{LEAK}$") when voltage $V_1$ (e.g., $V_{DDA}$) is applied thereto. $I_{LEAK}$ typically is generated in stand-by mode when some TCCT-based cells are accessed for a read or write operation while other TCCT-based cells are not. When the WL2 line is coupled to both a cell that is being accessed and to a cell that is not, $I_{LEAK}$ will be generated by the non-accessed cell. In particular, when an active WL2 signal is applied to the non-selected NDR device 12, the non-selected pass transistor 14 provides a path from the pass transistor's source terminal to its drain terminal. In this instance, $I_{LEAK}$ flows from NDR device 12 through both node "N" 40 and pass transistor 14 to bit line 26. Generally, one or more circuits connected to bit line 26 provide a path to ground, where such circuits typically can include a bit line pre-charge circuit, a signal sensing circuit, or other like circuitry.

Signal sensing circuits are commonly employed to sense or detect a low-level data signal voltage (or current) from a memory cell and then amplify it to a specific signal level, such as a value of the voltage (or current) representing a logical one (e.g., $V_{DDA}$) or zero (e.g., ground). A sense amplifier is one such sensing circuit designed to receive the data signal and a reference signal, and thereafter, resolve the data signal into a logical one or zero.

A drawback of using traditional bit line control techniques in conventional sense amplification is that excess charge is not sufficiently removed from the bit lines and sense amplifier nodes to overcome sense amplification errors. Such errors are typical exacerbated by temperature fluctuations, noise, device mismatch and like factors. Since TCCT-based memory cells provide data signals with very small voltages (e.g., 200 mV) for sense amplification, insufficient removal of excess charge can lead to sensing errors.

Another drawback of using traditional bit line control techniques and circuits is that a collective $I_{LEAK}$ in a memory device decreases power efficiency. Memory devices are designed to include one or more memory arrays, each memory array having numerous bit lines. In turn, each bit line can have more than one TCCT-based memory cells coupled to the bit line. For example, each bit line in a single or open bit line memory architecture can have thirty-two to more than a thousand TCCT-based memory cells coupled thereto. As the number of TCCT-based memory cells connected to the bit line increases, $I_{LEAK}$ increases proportionately. Hence, as $I_{LEAK}$ increases, the power consumed also increases. Moreover, as constituent device size (i.e., channel width) of NDR devices of TCCT-based memory cells continue to decrease, the associated $I_{LEAK}$ contribution from each individual memory cell increases. Conventional sensing circuits and bit line control techniques are thus not designed to minimize power consumption by TCCT-based memory cells during, for example, stand-by mode.

SUMMARY OF THE INVENTION

There is a need to overcome the aforementioned drawbacks of conventional sensing circuits and bit line control techniques to minimize power consumption by memory cells, such as TCCT-based memory cells, and to increase speed and reliability of sense amplification. The present invention provides for a circuit and a method for facilitating control of bit lines in preparation for, or during, sense amplification of data signals generated by TCCT-based memory cells. In accordance with a specific embodiment of the present invention, a sensing circuit includes a sense amplifier to resolve a data signal generated by a memory cell. The sensing circuit comprises a bit line coupled to the memory cell to receive the data signal, a first node connected to a first input of the sense amplifier. The first node is configured to couple with the bit line. A first pre-charge device is coupled to the bit line to pre-charge the bit line to a first predetermined level. Lastly, the circuit includes a second pre-charge device coupled to the first node to pre-charge the bit line to a second pre-determined level.

In another embodiment, a method provides control of a sensing circuit, where the method includes floating a bit line, pre-charging a first node to a first pre-determined level, pre-charging the bit line to a second pre-determined level, and coupling the bit line to the first node, the first node associated with a first sense amplifier input.

BRIEF DESCRIPTION OF THE DRAWINGS

The present invention is illustrated by way of example, and not by way of limitation, in the figures of the accompanying drawings where like reference numerals frequently refer to similar elements and in which.

DETAILED DESCRIPTION OF SPECIFIC EMBODIMENTS

Detailed descriptions of the embodiments are provided herein. It is to be understood, however, that the present invention may be embodied in various forms. Therefore, specific details disclosed herein are not to be interpreted as limiting, but rather as a basis for the claims and as a representative basis for teaching one skilled in the art to employ the present invention in virtually any appropriately detailed system, structure, method, process or manner.

The term "device" herein is used to describe both a discrete semiconductor circuit element, such as a MOS transistor or a TCCT device, as well as a semiconductor product. A memory semiconductor product can be referred also as a memory "chip" or "integrated circuit ("IC")" and is a circuit element operating cooperatively with other semiconductor products, such as a microprocessor.

Although the following exemplary circuits and methods are described generally in connection with a read operation of a memory device, the disclosed circuits and methods are designed to accommodate write operations as well as like memory device operations.

Figure 1:
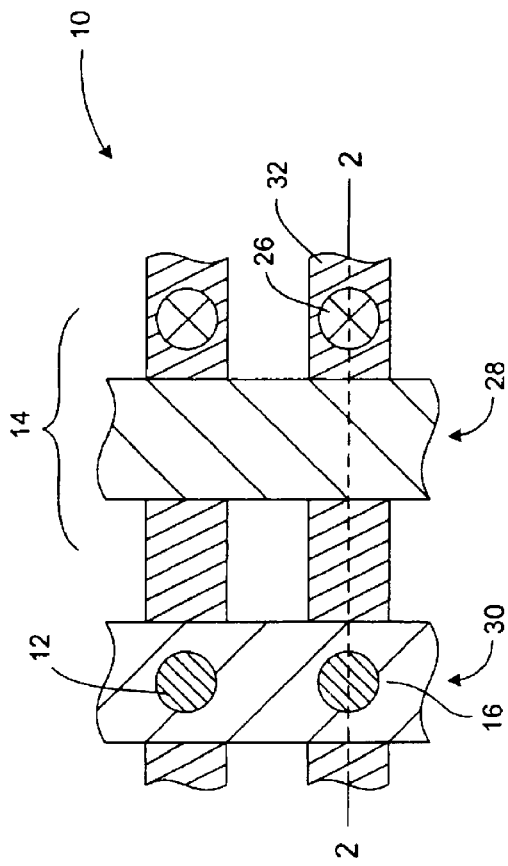
FIG. 1 shows a TCCT based memory cell of the prior art.
Figure 2:
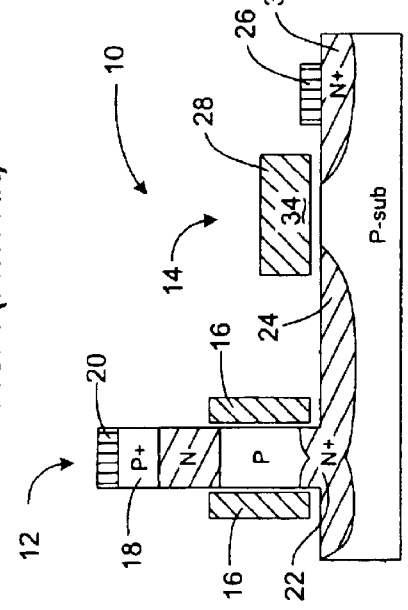
FIG. 2 shows a cross-section of the TCCT based memory cell of FIG. 1.
Figure 3:
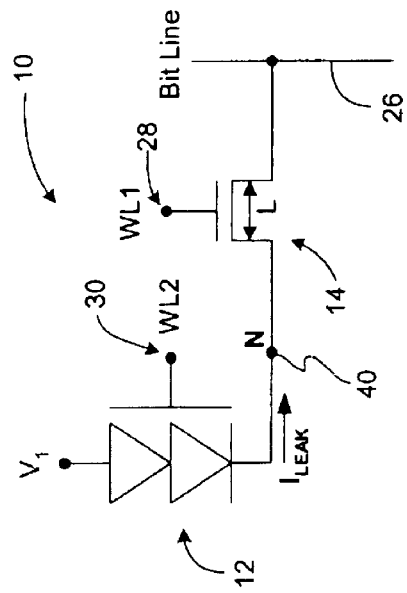
FIG. 3 shows a schematic circuit diagram of the TCCT based memory cell of FIG. 1.
Figure 4:
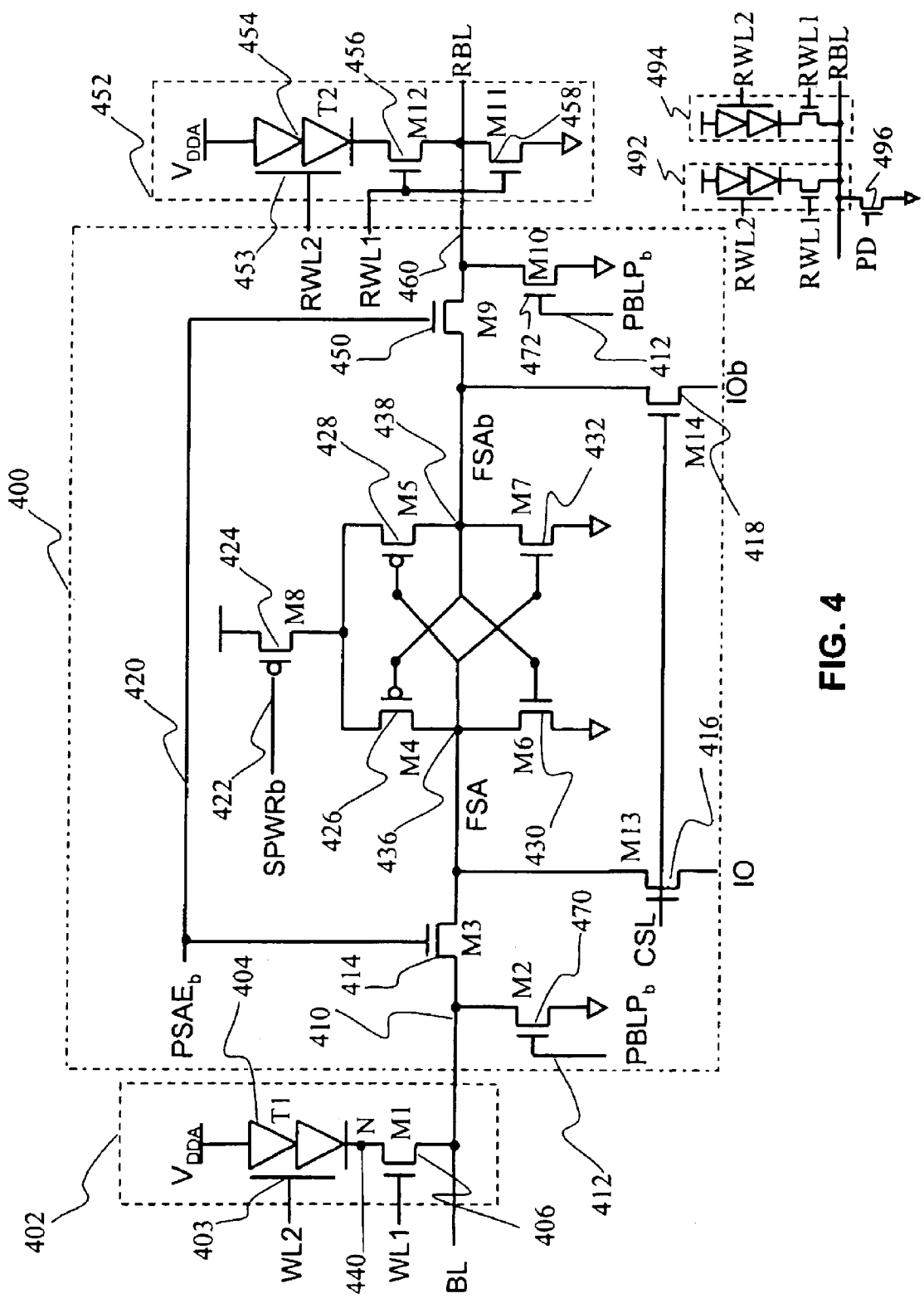
FIG. 4 is a schematic representation of an exemplary sensing circuit in accordance with one embodiment of the present invention.

FIG. 4 illustrates an exemplary sensing circuit in accordance with an embodiment of the present invention. In this example, sensing circuit 400 is coupled via a bit line 410 ("BL") and a reference bit line 460 ("RBL") to a NDR-based memory cell 402 and a NDR-based reference cell 452, respectively. In a specific embodiment, NDR-based memory cell 402 and NDR-based reference cell 452 are TCCT-based memory cells, where an exemplary TCCT-based memory cell 402 operates in a similar fashion as the TCCT-based memory cell described in connection with FIGS. 1–3.

In this instance, TCCT-based memory cell 402 operates to provide a data signal representing the content or unit of data stored within the cell to node 436. TCCT-based reference cell 452 operates to provide to node 438 a reference signal operating as a reliable baseline against which to compare the data signal. Depending on the magnitude of the data signal, for example, the sensing circuit 400 operates to resolve the data signal into a logic signal, such as a logical one or zero, adapted for a specific memory application.

Exemplary TCCT-based memory cell 402 includes an NDR device T1 404 having an anode coupled to a relatively high potential, such as $V_{DDA}$, and a cathode coupled to a terminal of switchable device, such as a pass transistor M1 406. A switchable device can also be any other type of mechanism for providing switch-like functionality as is known in the art. For example, a switchable device can provide a conduction path for electrons, or the like from one circuit node to another circuit node.

In particular, a drain terminal of M1 406 is coupled to the cathode of T1 404 and a source terminal of M1 406 is coupled to bit line BL 410. A gate-like device 403 of T1 404 and a gate terminal of M1 406 are designed to receive control signals, such as word lines two ("WL2") and one ("WL1"), respectively. In some embodiments, M1 is an n-channel metal oxide silicon ("NMOS") device, the operation, structure and manufacture of which are well known in the art. FIG. 4 shows node N 440 depicting a point of reference, similar to node N 40 of FIG. 3, at which to describe leakage current flowing from T1 404 through M1 406 to a lower potential.

Reference signal generation circuits are designed to provide a reference against which to compare a data signal (e.g., a voltage or current) representing a unit of data stored in a memory cell during sense amplification. An example of a type of reference signal generation circuit is a memory cell as configured to serve a reference memory cell. Reference cells are well known for providing reliably stable and accurate reference signals (e.g., reference voltages or currents) against which to compare the data signal. In some instances, reference cells can by dedicated reference cells. That is, their sole function is to provide a reference signal. In other instances, reference cells can be memory cells used to store data at one point in time, but also can be used to provide reference signals at another point in time.

In one embodiment in accordance with the present invention, exemplary device T2 454 of reference memory cell 452 is a dedicated reference memory cell. In this example, an anode of NDR device T2 454 is coupled to gate-like device 453 (i.e. reference word line two "RWL2"

is fixed to its activated state) so that both receive a relatively high voltage (not shown), such as $V_{DDA}$ or other like voltages. Since $V_{DDA}$ is applied to both the anode and gate-like device 453 of T2 454, device T2 454 is in the "on" state to provide a data signal as a pre-reference voltage. The pre-reference voltage signal has a magnitude substantially equivalent to the data signal representing a logical one, as provided by memory cell 402 and is used to generate a reference signal.

In this configuration, the dedicated reference memory cell functions to provide a reliably stable and fixed reference voltage rather than a typical memory cell, which is designed to provide a data signal having at least two voltage levels where each level corresponds to a logical state. Such data signals can have a magnitude of 200 to 250 mV to represent a logical one and a magnitude of about 0 mV to represent a logical zero. In this configuration, T2 454 operates to provide a voltage or current having a substantially fixed magnitude and generally does not function to store units of data (i.e., does not operate as a standard memory cell).

T2 454 also has a cathode coupled to a terminal of a switchable device, such as a pass transistor M12 456. In particular, pass transistor M12 456 has a drain terminal coupled to the cathode of T2 454, a source terminal coupled to reference bit line RBL 460, and a gate terminal designed to receive reference word line one control signal ("RWL1").

Exemplary reference cell 452 further includes a resistive element, such as a pull-down transistor M11 458. M11 458 is coupled between RBL 460 and a relatively low potential (e.g., ground) for clamping, or limiting, RBL 460 to a voltage level designed to provide an appropriate margin for resolving the data signal into a logical signal (i.e., logical one or zero). That is, M11 458 operates to reliably generate and provide a reference signal having a margin substantially proportional (e.g., approximately ½) to the maximum voltage reached on BL 410. The margin is represented in the figures as "delta Vbl" and is described below in connection with FIG. 5. Although the relatively low potential in FIG. 4 is shown to be ground, one having ordinary skill in the art should appreciate that the low potential can be any voltage lower than that of $V_{DDA}$, which includes potentials below ground.

M12 456 and M11 458 are configured to operate as a voltage divider using a prereference voltage (or current) from T2 454. In particular, M12 456 and M11 458 are designed such that the pre-reference voltage is divided across individual devices M11 and M12, either equally or differently, to provide a reference voltage at RBL 460. For example, if M11 and M12 have approximately the same resistance, then the voltage drop across each M11 and M12 is equivalent. Thus, if T1 and T2 respectively produce a data signal and a pre-reference signal having substantially the same magnitude, then the reference signal (i.e., voltage on the reference bit line) is about one-half of the data signal.

Pass transistor M12 456 and pull-down transistor M11 458 each have a channel length, L, and a width, W that can be modified to provide an appropriate reference voltage level. In some embodiments, pass transistor M12 456 and the pull-down transistor M11 458 are designed to have a W/L ratio that is about half of the W/L ratio for pass transistor 14 of FIG. 3, which can be equivalent to M1 406 of FIG. 4. Halving the W/L ratio is achieved in some of these embodiments, for example, by using the same width, W, in combination with twice the channel length, 2 L.

A suitable reference cell for practicing a specific embodiment of the present invention is disclosed in an patent application owned by common assignee, T-RAM, Inc., which is entitled "Reference Cells for TCCT-Based Memory Cells," U.S. patent application Ser. No. 10/117,930, filed on Apr. 5, 2002, and is incorporated herein by reference for all purposes.

In another embodiment in accordance with the present invention, exemplary TCCT-based reference memory cell 452 is implemented using a common pull-down device 496 and at least one of a number of TCCT-based memory cells 492, 494. Memory cells 492, 494 are coupled to a reference bit line, such as RBL 460, for individually providing a data signal, similar to that generated by TCCT-based memory cell 402, as a pre-reference signal.

Each NDR device of memory cells 492, 494 is designed to receive RWL2 at a respective charge-plate or gate-like device. The NDR devices of memory cells 492, 494 are activated when an activation signal (e.g., $V_{DDA}$) is applied to a respective charge-plate or gate-like device by RWL2, and deactivated when a deactivation signal (e.g., ground) is applied similarly to a respective gate-like device by RWL2. Thus, the signal RWL2 operates similar to the WL2 associated with memory cell 402, and permits each of memory cells 492, 494 to operate as a reference memory cell 452 when pull-down device 496 is activated. One having ordinary skill in the art will recognize that signals RWL2 applied to each of memory cells 492, 494 can be the same signal when respective charge-plates or gate-like devices are coupled together. Moreover, a skilled artisan will appreciate that the signals RWL1 applied to each of memory cells 492, 494 can be different signals so that one of memory cells 492, 494 is selected to provide a pre-reference voltage signal.

Common pull-down device 496, similar to M11 458 in function and structure, is configured to permit memory cells 492, 494 to operate as standard memory cells when a control pull-down signal ("PD") is at one state and as reference memory cells when signal PD is at another state. The function and structure of common pull-down device 496 is described above in connection with the discussion of M11 458.

As an example of the operation of memory cells 492, 494, suppose signal PD is at a first state such that pull-down device 496 is non-conducting. As such, memory cells 492, 494 can be used to store units of data similar to memory cell 402. When signal PD is at a second state, pull-down device 496 functions to divide the pre-reference signal into a reference signal.

Consider further that memory cell 494 is to be selected to provide the pre-reference signal. To select memory cell 494, an activating state of signal RWL1 is applied to the pass transistor of memory cell 494. Concomitantly, other memory cells coupled to the reference bit line, such as memory cell 492, are deselected by applying a deactivating state of signal RWL1 to the pass transistors of memory cell 492. After memory cell 494 is selected and pull-down device 496 is activated, then the data signal (i.e., pre-reference voltage signal) is transferred from memory cell 494 to the reference bit line. Thereafter, the data signal is divided across the resistances of the pass transistor of memory cell 494 and pull-down device 496 to generate the reference signal.

Other embodiments of the invention are readily envisioned. For example, either or both of the pass transistor M12 456 and pull-down transistor M11 458 can be replaced with two other transistors connected in series, where each of these transistors has a channel length, L, equal to that of the pass transistor 14 of FIG. 3. In a specific embodiment according to the present invention, pass transistor M12 456 and pull-down transistor M11 458 do not share a common RWL1 line (not shown), as does the example described in connection with FIG. 4. In such an instance, pass transistor M12 456 and pull-down transistor M11 458 can have different widths, different channel lengths, and can be operated at different voltages.

Figure 5:
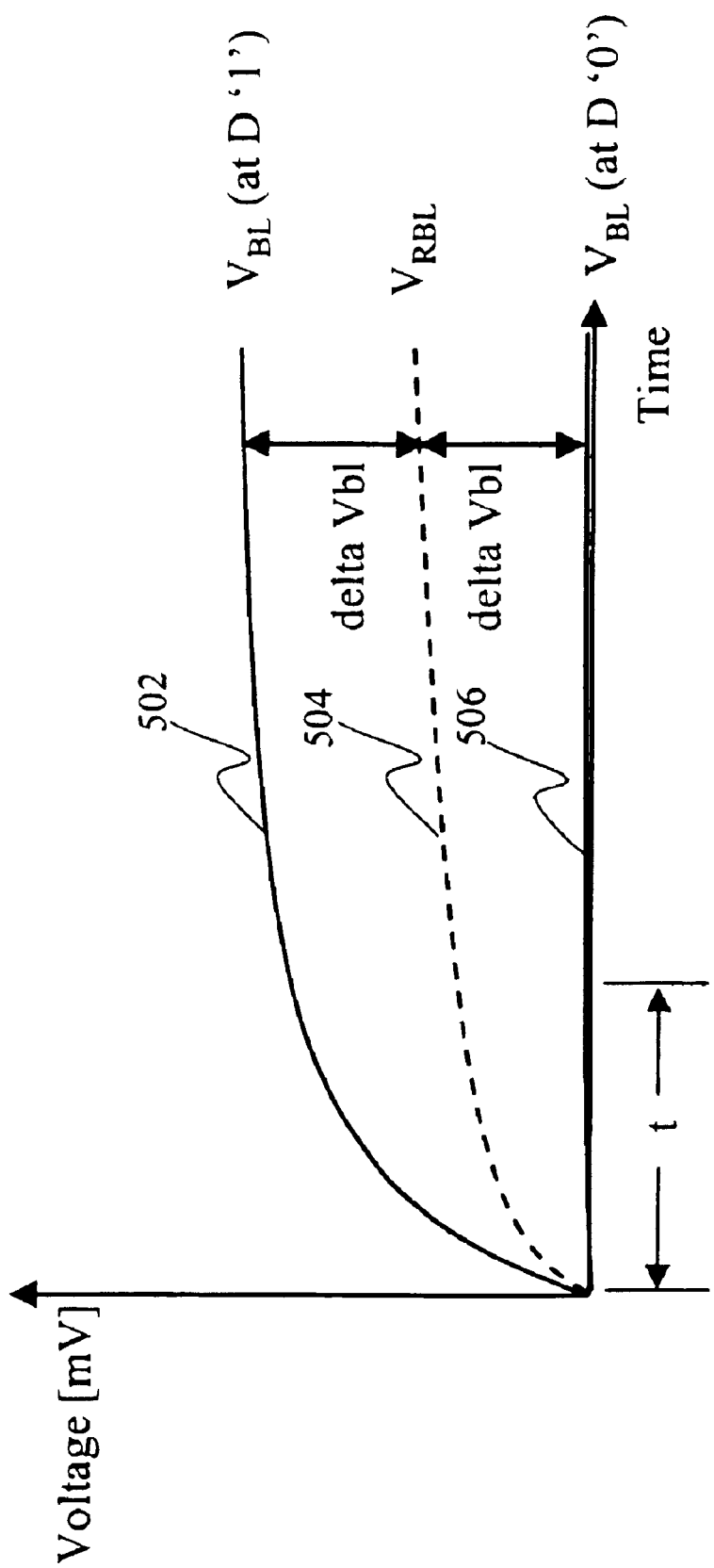
FIG. 5 is a graphical representation of voltage profiles of a memory and reference cell.

FIG. 5 illustrates a voltage rise profile achieved in accordance with one embodiment of the present invention. The voltage rise profiles for the data and reference signals, when applied to the bit and reference bit lines, respectively, develop over time in accordance with an exemplary relationship as described by the following equation:

$$v(t)=v(1-e^{-t/RC}),$$

where "C" represents the bit line capacitance and "R" represents the equivalent resistance of the one or more devices, such as M11 and M12. As an example, when a stored logical one (i.e., D '1') is read from a memory cell, an associated voltage is applied to bit line BL, wherein the associated voltage is designed to have a relationship with the reference bit line voltage as follows:

$$V_{BL}=V_{RBL} \pm \text{delta } V_{BL},$$

$V_{RBL}$ is set to approximately one-half $V_{BL}$ with, for example, a voltage divider configuration as described above. A skilled artisan should recognize that the margin between $V_{RBL}$ and $V_{BL}$ when at "D1" need not be equivalent to the margin between $V_{RBL}$ and $V_{BL}$ at "D0".

As an example, when TCCT-based memory cell 402 of FIG. 4 operates in read mode (i.e., when at least WL1 is activated), cell 402 provides a data signal to BL 406 for determining the logical value of the stored unit of data during sense amplification. When a logical state of "one" is read from T1 404 and applied to BL 406, the data signal generated by memory cell 402 has an exemplary voltage profile (i.e., magnitude over time) such as shown as "D1" 502 of FIG. 5.

Likewise, when a logical state of "zero" is applied to BL 406, the data signal generated by memory cell 402 is shown having a magnitude over time as "D0" 506 of FIG. 5, which is a negligible voltage and hence can be equivalent to a ground potential. In one example, the magnitudes of a data signal representing a logical one (i.e., D '1') and logical zero (i.e., D '0') are configured to be approximately 200 mV and 0 mV, respectively. Hence, the magnitude of a reference signal can be set to approximately ½ of 200 mV for providing a margin delta $V_{BL}$ of around 100 mV (i.e., the reference signal magnitude is 100 mV above D '0' and 100 mV below D '1').

In operation, reference cell 452 of FIG. 4 generates a reference signal having an exemplary reference signal profile 504 of FIG. 5. As shown in FIG. 5, the voltage rise for the reference cell is proportional to that for the TCCT based memory cell providing a logical one. In one embodiment, the reference cell voltage rises at about half the rate of the TCCT based memory cell voltage when the data signal represents a logical one. For example, if a memory cell is configured to provide data signal D 1 502 having a maximum magnitude of about 200 mV, then the reference memory cell can be designed to provide reference signal 504. If the reference memory cell provides a margin delta Vbl 510 of half the magnitude of a data signal representing a logical one, then the reference signal has a magnitude of about 100 mV. Likewise, if margin delta Vbl 512 is half the magnitude of a data signal representing a logical one, then a data signal D 0 506 has a magnitude of about 0 mV while the reference signal has a magnitude of about 100 mV.

An exemplary TCCT-based reference cell of FIG. 4 of the present invention can be modeled as a resistor-capacitor ("RC") circuit to determine the appropriate reference signal voltage. If pass transistor M12 456 is modeled as having a resistance "R1," pull-down transistor M11 458 is modeled as having a resistance "R2," the pre-reference voltage is modeled as having a voltage "$v_1$" and RBL 460 is modeled as having a capacitance "C," then the following general equation:

$$V_{REF}(t)=v[R2/(R1+R2)](1-e^{-t(R1+R2)/[R1R2C]})$$

can be useful in determining an appropriate voltage rise on reference bit line 460 in the design of pass transistor M12 456 and pull-down transistor M11 458 in accordance with the present invention. Moreover, such an equation can be used to determine an appropriate time, "t" of FIG. 5, at which to sample the data and reference signals near or during a sense amplification operation.

It should also be noted that the present invention is not limited to TCCT-based reference cells, though it is primarily described with reference thereto. One having ordinary skill in the art should appreciate that other types of memory cells, for example SRAM cells, MRAM cells, memory cells with floating gates such as flash memory cells, and like memory cells also represent different logical states with high and low voltage outputs. Any of these and like memory cells, when configured to be permanently in an "on" state (i.e., providing a data signal as a pre-reference signal), can be readily substituted for T2 454.

An exemplary signal sensing circuit is shown in FIG. 4 as sensing circuit 400. Exemplary sensing circuit 400 senses whether the magnitude of the data signal representing the unit of data is a logical one or zero, in part, by controlling the transfer of the data and reference signals to the sense amplifier as discussed below.

Sensing circuit 400 includes pre-charge devices M2 470 and M10 472 for at least equalizing the amount of charge on BL 410 and RBL 460 to ground or any other potential level by, for example, discharging excess charge (i.e., pre-charging the bit lines to ground). With excess charge discharged, signal propagation is faster and sensing is made more reliable than if excess charge remains on the signal lines in which data and reference signals are applied. Each pre-charge device M2 470 and M10 472 has a drain terminal coupled to a respective bit line BL 410 and RBL 460, a gate terminal configured to receive pre-charge bit line control signal ("PBLP$_b$") 412 and a source terminal coupled to a relatively low potential, such as ground. Upon receiving control signal PBLP$_b$ in one state, pre-charge devices M2 470 and M10 472 activate to provide a path to the low potential so as to add or subtract charge with each respective bit line.

Sensing circuit 400 also includes sense amplifier-enable devices M3 414 and M9 450. Devices M3 414 and M9 450 function to enable signals on BL 410 and RBL 460 to be applied to nodes FSA 436 and FSA$_b$ 438, respectively, which are associated with input terminals of the exemplary sense amplifier shown in FIG. 4. Each sense amplifier-enable device M3 414 and M9 450 has a first terminal (e.g., drain) coupled to respective nodes FSA 436 and FSA$_b$ 438, a second terminal (e.g., source) coupled to respective bit lines BL 410 and RBL 460, and a gate terminal configured to receive sense amplifier-enable control signal ("PSAE$_b$") 420. When devices M3 414 and M9 450 receive control signal PSAE$_b$, they activate to provide a path from memory cell 402 and reference cell 452 to nodes FSA 436 and FSA$_b$ 438 of the sense amplifier.

The exemplary sense amplifier shown in FIG. 4 is a cross-coupled inverter pair, each inverter composed of complementary metal oxide semiconductor ("CMOS") transistor devices. More specifically, the sense amplifier includes a first inverter having an output terminal connected to an input terminal of a second inverter, and the second inverter's output terminal is connected to an input terminal of the first inverter.

The first CMOS inverter includes p-channel MOSFET ("PMOS") device M4 426 and NMOS device M6 430 in a cross-coupled configuration with the second CMOS inverter. The second inverter includes PMOS device M5 428 and NMOS device M7 432. NMOS devices M6 430 and M7 432 each have a source terminal coupled to a low potential such as ground. A drain terminal of M4 426 is coupled to a drain terminal of device M6 430 at node FSA 436, and similarly, a drain terminal of M5 428 is coupled to a drain terminal of device M7 432 at node $FSA_b$ 438. Device M4 426 has a source terminal coupled to a common node (i.e., PMOS source node) to which a source terminal of M5 428 is also coupled.

In this example, a switchable device, such as PMOS transistor device M8 424, is coupled between the PMOS source node and a relatively high potential, such as $V_{DDA}$. In particular, M8 424 has a source terminal coupled to $V_{DDA}$, a drain terminal coupled to the PMOS source node (and thus to the source terminals of devices M4 426 and M5 428), and a gate terminal configured to receive a sensing power control signal ("$SPWR_b$") 422. Device M8 424 operates to provide power to the sense amplifier during the sensing stage of a memory read cycle for enabling the functionality of the sense amplifier. One having ordinary skill in the art will appreciate that in certain applications M8 424 is optional and that the PMOS source node can be connected directly to $V_{DDA}$. In other embodiments, a switchable device similar in functionality of device M8 424, but suited for operation with devices M6 430 and M7 432, can be coupled between the sources of devices M6 430 and M7 432 and a low potential, such as ground.

The cross-coupled inverter pair constituting exemplary sense amplifier of FIG. 4 operates similar to bi-stable elements known in the art, such as a flip flop device. In particular, before the sense amplifier is enabled, nodes FSA 436 and $FSA_b$ 438 are equalized such that the cross-coupled inverter pair is at a metastable point. When nodes FSA 436 and $FSA_b$ 438 become unequal, the cross-coupled inverter pair will toggle or latch to a stable state such that node FSA 436 will stabilize a voltage representing either a logical one or logical zero (with $FSA_b$ 438 latching to the complementary state). One having ordinary skill in the art will recognize that the transistor devices need not be identical in size nor have identical operating characteristics to configure the sense amplifier to be insensitive to thermal and noise variations and the like. Furthermore, a skilled artisan will recognize that the cross-coupled inverter pair is but only one of a number of suitable sense amplifier circuits that can be used to practice the present invention.

Sensing circuit 400 further includes input/output transistor devices M13 416 ("IO") and M14 418 ("$IO_b$"). Each input/output device M13 416 and M14 418 has a first terminal (e.g., drain) coupled to respective nodes FSA 436 and $FSA_b$ 438, a second terminal (e.g., source) coupled to a relatively low potential, such as ground, and a gate terminal configured to receive a column select control signal ("CSL"). In operation, control signal CSL is applied to activate M13 416 and M14 418 for transmitting complementary sense amplifier output signals representing a resolved data signal, such as a logical one or zero. Such outputs can thereafter be communicated to a global sense amplifier, to complementary local input/output lines, or to any other circuitry in which processing of the data signal is desired.

Figure 6:
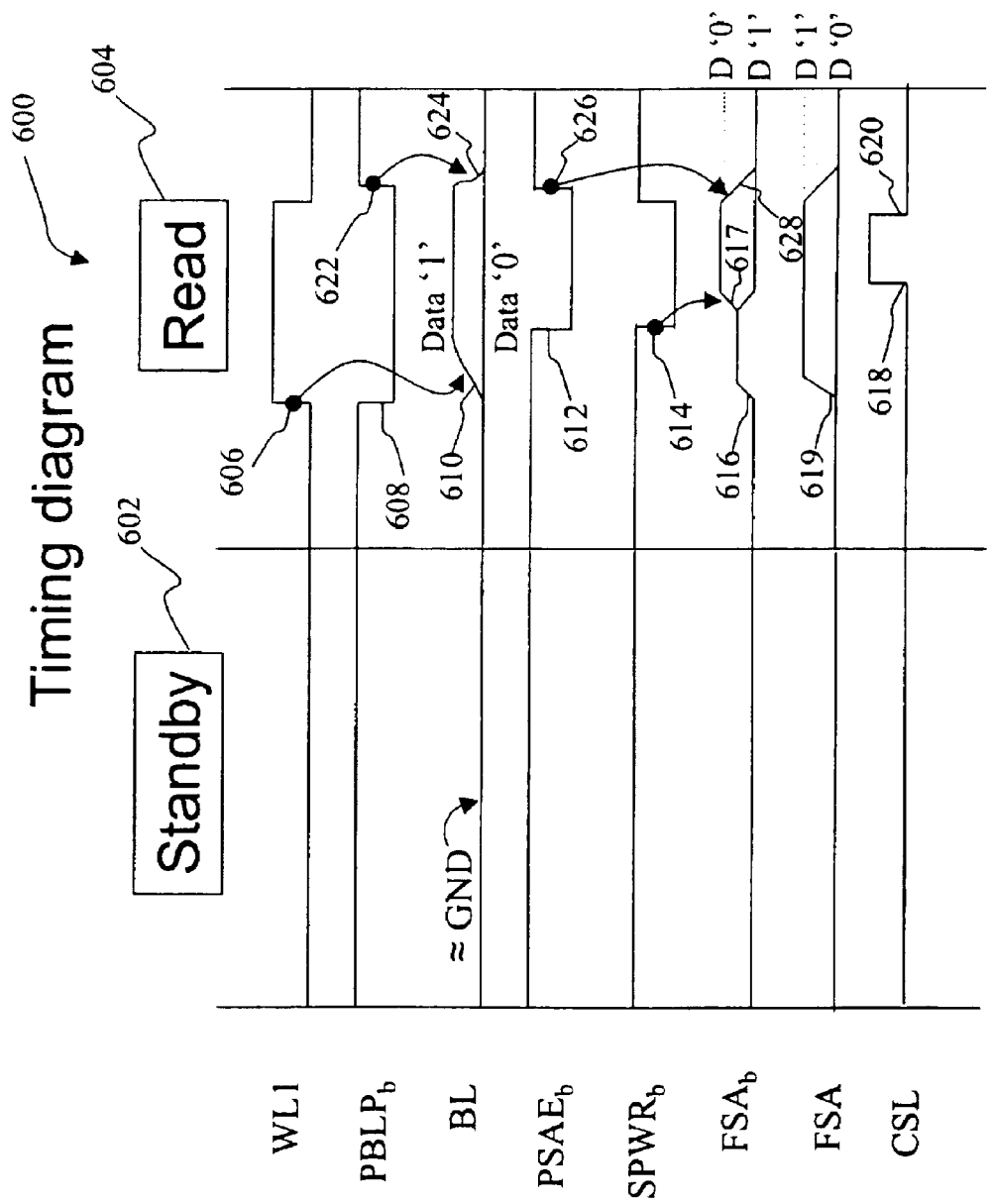
FIG. 6 is a timing diagram in accordance with a specific embodiment of the present invention.

FIG. 6 is a timing diagram illustrating an exemplary timing sequence and control signal relationship when activating and deactivating circuit elements of exemplary sensing circuit 400 of FIG. 4. FIG. 6 also depicts timing and levels of circuit elements acted upon by the control signals, such as bit lines BL and nodes FSA, etc. Timing diagram 600 delineates the operation of an exemplary sensing circuit of the present invention into a stand-by mode 602 and a read mode 604. Stand-by mode 602 depicts the state of the control signals while a memory device incorporating exemplary sensing circuit 400 is not performing a read operation, for example.

In stand-by mode 602 WL1 is deactivated so that M1 406 isolates T1 404 from BL 410, and $PBLP_b$ is activated so that M2 470 can pre-charge BL 410 and M10 472 can pre-charge RBL 460. In some embodiments, pre-charging takes the bit lines to ground, or ≈0 mV. Further, $PSAE_b$ is activated so that M3 414 couples BL 410 to node FSA 436 and so that M9 450 couples RBL 460 to node $FSA_b$ 438. Additionally, $SPWR_b$ is activated so that M8 424, being an NMOS device, decouples the sense amplifier from its voltage source, and CSL is deactivated so that M13 416 decouples node FSA 436 from IO and so that M14 418 decouples node $FSA_b$ 438 from IOb.

During an exemplary read operation in read mode 604, at edge 606 WL1 is activated to read a data signal representing the stored unit of data onto BL 410 of FIG. 4. At about the same time, at edge 608, $PBLP_b$ 412 is deactivated so that devices M2 470 and M10 472 of FIG. 4 are isolated from their respective bit lines 410, 460. Consequently, after edges 606 and 608, the bit line BL 410 will follow one of the two voltage profiles shown in FIG. 5 at or near signal transition 610 of FIG. 6, depending whether the stored unit of data being read onto BL 410 represents a logical one (D '1') or zero (D '0'). Since BL 410 remains coupled to node FSA 436 by M3 414 the voltage on node FSA 436 will follow that on BL 410 at or near edge 619. Similarly, because device M10 472 no longer pre-charges the reference bit line RBL 460 after edge 608, the voltage on the RBL 460 and at node $FSA_b$ 438 after edge 608 will rise to the reference voltage, shown by signal transition 616 of FIG. 6.

Next, at or near edge 612, control signal $PSAE_b$ 420 is removed from devices M3 414 and M9 450 of FIG. 4 to isolate node FSA 436 from BL 410 and to isolate node $FSA_b$ 438 from RBL 460. Once this occurs, WL1 can be deactivated to again isolate T1 404 from BL 410, and $PBLP_b$ can again be activated so that M2 470 and M10 472 can pre-charge their respective bit lines 410, 460.

Approximately at or near the time of edge 612, at edge 614 control signal $SPWR_b$ 422 of FIG. 4 is removed from device M8 424 to couple the sense amplifier to its voltage source to provide, for example, $V_{DDA}$ thereto. Thereafter, the voltage at node FSA 436 remains essentially unchanged while the voltage at node $FSA_b$ 438 is driven to a state complementary to that of FSA 436. For example, where the voltage on node FSA 436 is high to represent a logical one, the voltage at node $FSA_b$ 438 is driven from the reference voltage to ground. Alternatively, when FSA 436 is low to represent a logical zero, the voltage at node $FSA_b$ 438 is driven from the reference voltage to a higher voltage such as $V_{DDA}$. Accordingly, the line representing $FSA_b$ in FIG. 6 bifurcates at edge 617 to either of a high or a low voltage state. When the voltages on the two nodes 436, 438 have stabilized the nodes 436, 438 are said to be latched.

Once the sense amplifier has latched nodes FSA 436 and FSA$_b$ 438, control signal CSL at or near edge 618 activates devices M13 416 and M14 418 to couple nodes FSA and FSA$_b$ to IO and IO$_b$, respectively. Thus, a logical one is read by applying a relatively high voltage on IO and a relatively low voltage on IO$_b$, and a logical zero is read by applying a relatively low voltage on IO and a relatively high voltage on IO$_b$.

After a time sufficient for the respective nodes 436, 438 to be read onto IO and IO$_b$, the sense amplifier circuit 400 begins to return to the stand-by mode at or near edge 620 when control signal CSL deactivates devices M13 416 and M14 418 to again isolate nodes FSA 436 and FSA$_b$ 438 from IO and IO$_b$, respectively. Thereafter, control signal SPWR$_b$ 422 can be restored to device M8 424 to again decouple the sense amplifier from its voltage source. Then, at edge 626 control signal PSAE$_b$ 420 is restored to devices M3 414 and M9 450 of FIG. 4 to again couple nodes FSA 436 and FSA$_b$ 438 to their respective bit lines 410, 460. If WL1 has not been previously deactivated it may be deactivated at this time. Similarly, if PBLP$_b$ has not yet been activated it may be activated at this time. Once all of the control signals have been restored to their respective stand-by levels, at edge 628 the voltages on nodes 436, 438 equalize and return to about ground or ≈0 mV.

Figure 7:
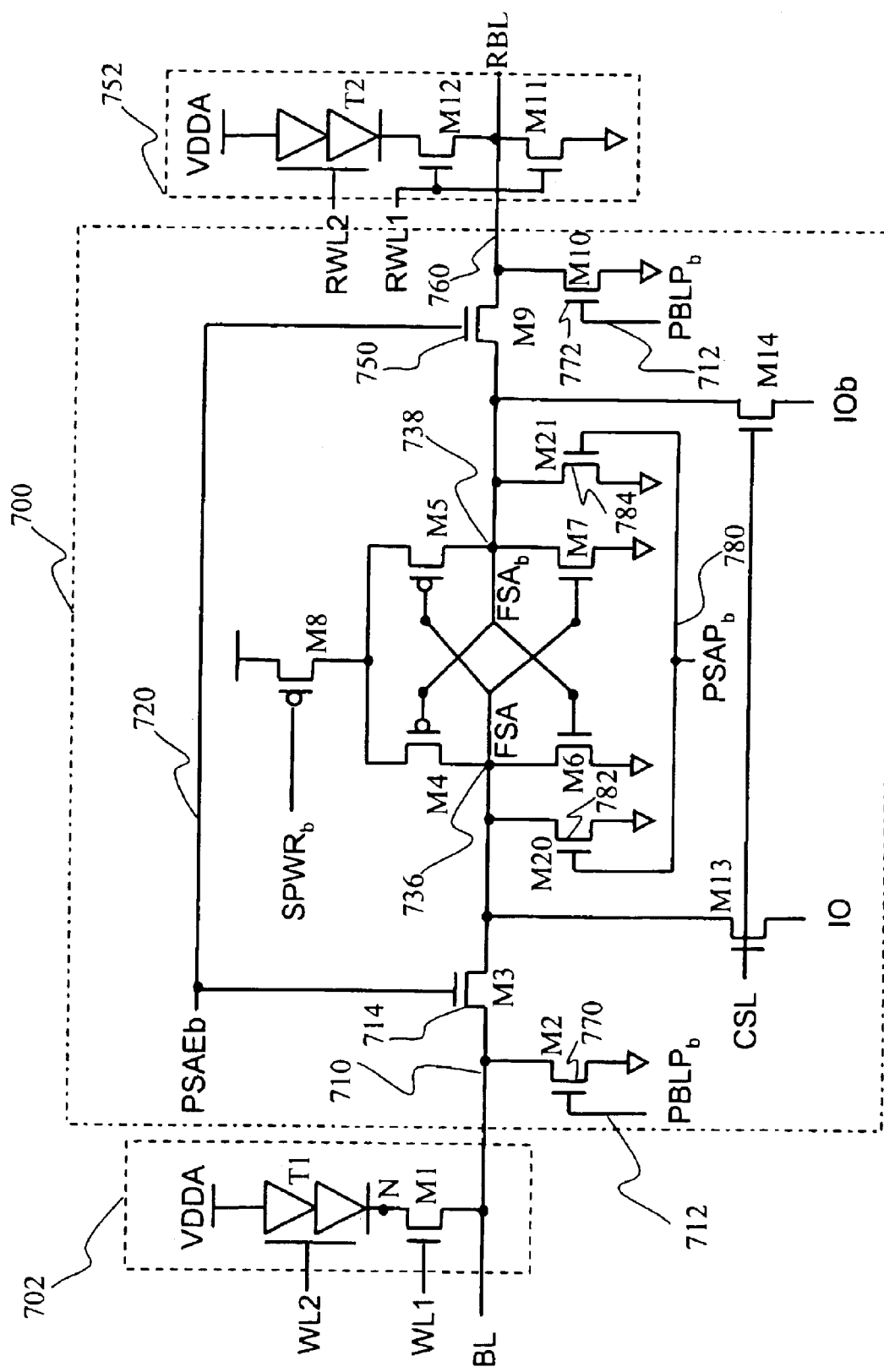
FIG. 7 is a schematic representation of an exemplary sensing circuit in accordance with another embodiment of the present invention.

FIG. 7 shows an exemplary sensing circuit 700 in accordance with another specific embodiment of the present invention. In this example, memory cell 702 and reference cell 752 can be similar in function and structure to memory cell 402 and reference cell 452 of FIG. 4, respectively. The individual circuit elements of sensing circuit 700 of FIG. 7 can be similar in structure and functionality of the individual circuit elements of sensing circuit 400 of FIG. 4. The functionality of the combined circuit elements of sensing circuit 700, however, is performed in difference sequences in time than those depicted in FIG. 6. Moreover, additional devices not found in sensing circuit 400 of FIG. 4 have been incorporated in sensing circuit 700 to provide for a floating bit line methodology.

In particular, devices M20 782 and M21 784 are designed to pre-charge nodes FSA 736 and FSA$_b$ 738 to establish reliably equalized nodes for the sense amplifier in a manner similar to how bit line BL 710 and reference bit line RBL 760 are pre-charged, as described above. In operation, while control signal PSAP$_b$ 780 is in a first state (e.g., at a high state), its application to devices M20 782 and M21 784 causes these devices to clamp nodes FSA 736 and FSA$_b$ 738 to a relatively low voltage, such as ground. While control signal PSAP$_b$ 780 is in a second state (e.g., at a low state) devices M20 782 and M21 784 deactivate, which allows nodes FSA 736 and FSA$_b$ 738 to receive a data signal and reference signal, respectively.

Figure 8:
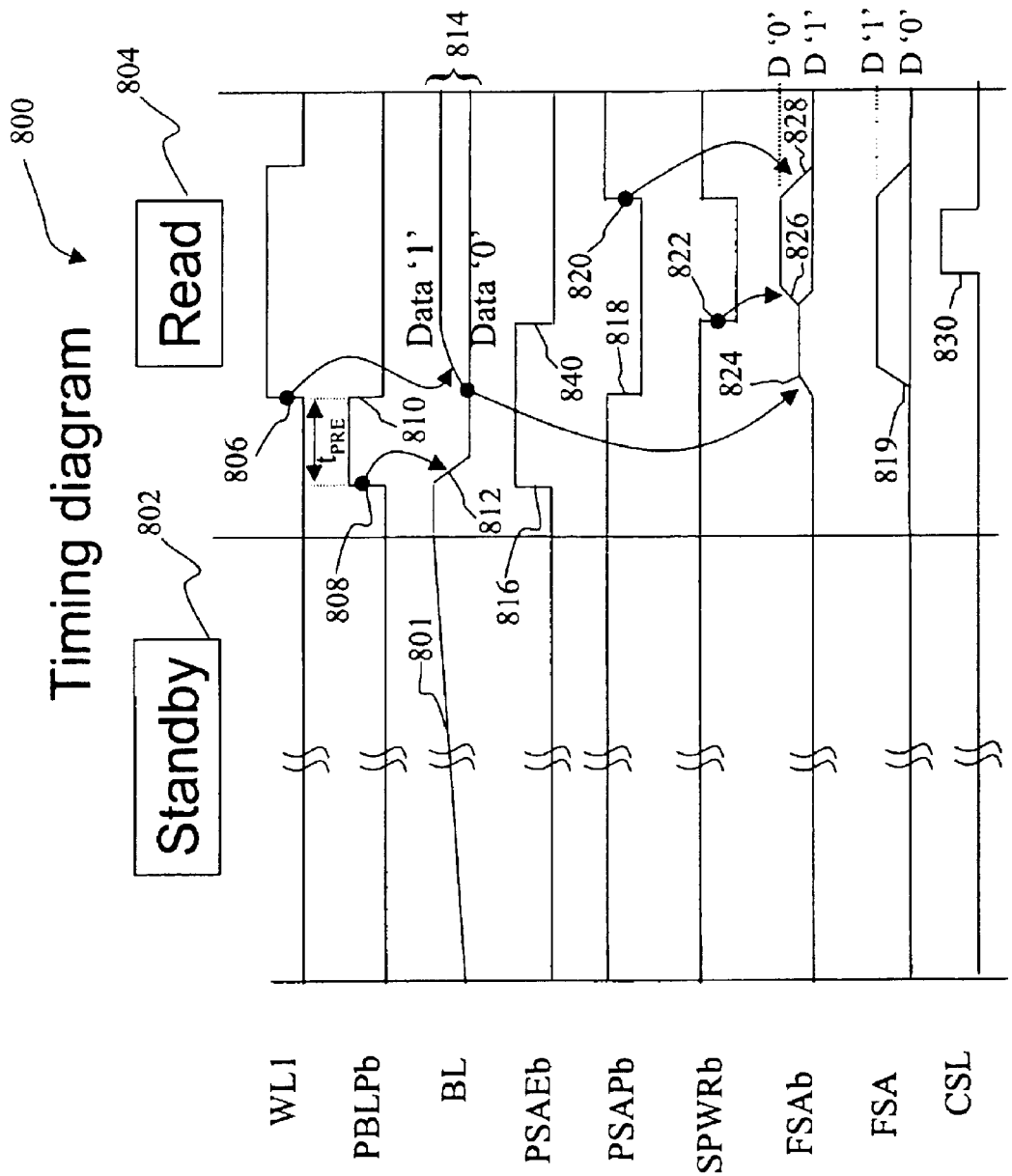
FIG. 8 is a timing diagram in accordance with another specific embodiment of the present invention.

FIG. 8 is a timing diagram illustrating another exemplary timing sequence and control signal relationship when activating and deactivating circuit elements of exemplary sensing circuit 700 of FIG. 7. FIG. 8 also depicts timing and levels of circuit elements acted upon by the control signals, such as bit lines BL and nodes FSA, etc. Timing diagram 800 depicts a stand-by mode 802 and a read mode 804, in which stand-by mode 802 depicts the states of the control signals and circuit elements while a memory device incorporating exemplary sensing circuit 700 is not performing a read operation.

In this example, the bit line and/or reference bit line of sensing circuit 700 of FIG. 7 can be designed to "float" individually or concurrently when in stand-by mode so as to reduce leakage current through, for example, the pre-charge transistors. As shown, BL 710 of FIG. 7 is permitted to float with an exemplary voltage magnitude profile 801 of FIG. 8. Although the reference bit line RBL is not shown in FIG. 8, it has a similar floating voltage magnitude profile.

Prior to reading a voltage onto BL 710, however, control signal PBLP$_b$ changes state at or near edge 808. Upon receiving a control signal PBLP$_b$ at a high state at 816, devices M2 770 and M10 772 operate to pre-charge bit line BL 710 and reference bit line RBL 760 to approximately 0 mV or ground. After time "$t_{PRE}$," which represents the pre-charge time, control signal PBLP$_b$ transitions to its low state at or near edge 810, which is approximately when WL1 is activated at or near edge 806. In this instance, "$t_{PRE}$" can be optimized to minimize leakage current while providing for an appropriate amount of excess charge elimination.

At or near edge 808, bit line BL is pre-charged around or during signal transition 812. At nearly the same time, as PBLP$_b$ transitions to a high state at edge 808, control signal PSAE$_b$ transitions to a high state. In a high state, PSAE$_b$ enables devices M3 714 and M9 750 to provide a path from memory cell 702 and reference cell 752 to respective nodes FSA 736 and FSA$_b$ 738 associated with the respective sense amplifier inputs for sense amplification.

At or near edge 806, WL1 is activated so that a data signal representing the stored unit of data is read onto BL 710 of FIG. 7. Although not shown in FIG. 8 for purposes of clarity, RWL1 is activated nearly in the same manner as WL1 is activated so that a reference signal is applied to RBL 760. Once WL1 is applied to activate a pass transistor at edge 806, bit line BL 710 has a voltage profile 814 of FIG. 8, depending on whether the value of the stored unit of data read from the memory cell represents a logical one or zero.

Control signal PSAE$_b$ transitions from a high state to a low state at or near edge 816 prior to or approximately near the time that the data signal is applied to bit line 710 at edge 806. Control signal PSAEb enables nodes FSA 736 and FSA$_b$ 738 to accommodate data and reference signals, respectively. Up through signal transition 818, PSAP$_b$ 780 is in a high state to activate devices M20 782 and M21 784 to pre-charge nodes FSA 736 and FSA$_b$ 738. At or near signal transition 818, PSAP$_b$ changes state to float nodes FSA 736 and FSA$_b$ 738 (i.e., deactivating devices M20 782 and M21 784) so they can accommodate data and reference signals.

When PSAP$_b$ transitions to a low state at edge 818, nodes FSA 736 and FSA$_b$ 738 have a data signal and a reference signal respectively applied thereto at or near signal transitions 824 and 819. That is, after edge 810, device M20 782 is deactivated to float node FSA 736. With BL 710 coupled to node FSA 736 by M3 714, the voltage on node FSA 736 at or near signal transition 819 will follow that on BL 710 at or near signal transition 806. Also after edge 810, devices M21 784 and M10 772 are deactivated to float node FSA$_b$ 738 and reference bit line RBL 760. With RBL 760 coupled to node FSA$_b$ 738, the voltages on the RBL 760 and node FSA$_b$ 738 after edge 810 will rise to the reference voltage, shown by signal transition 824 of FIG. 8. Accordingly, the line representing FSA$_b$ in FIG. 8 bifurcates at edge 826 to either of a high or a low voltage state. When the voltages on the two nodes 736, 738 have stabilized the nodes 736, 738 are said to be latched.

At or near edge 822, control signal SPWR$_b$ transitions from a high state to a low state to enable the sense amplifier to sense and to resolve the data signal on the bit line in view of the reference signal. About the same time, control signal PSAE$_b$ transitions from a high to a low state at or near edge 840 to, for example, prevent charge from leaking through other circuits before the sensing function is performed.

Thereafter, the sense amplifier operates to determine the complementary data signals at nodes FSA 736 and $FSA_b$ 738 as described above at or near signal transitions 826 and 819. Once the data signal has been resolved into complementary data signals (e.g., node FSA 736 is resolved into a logical one and node $FSA_b$ 738 is thereby resolved into a logical zero), control signal CSL is applied at or near edge 830 to activate M13 and M14 for transmitting the complementary sense amplifier output signals representing resolved data signals. Thereafter, the complementary sense amplifier signals are communicated to a global sense amplifier, to complementary input/output lines (i.e., IO and $IO_b$) or to other circuitry in which processing of the data signal is desired.

As the read operation ends, control signal $PSAP_b$ changes to a state at edge 820 so as to pre-charge nodes FSA 736 and $FSA_b$ 738 in preparation for the next read operation. As $PSAP_b$ changes to a next state at or near edge 820, nodes FSA 736 and $FSA_b$ 738 will return to their equalized states. Around the time that $PSAP_b$ changes state at or near edge 820, control signal $SPWR_b$ changes to a state to deactivate device M8 of FIG. 7. As described above, deactivation of device M8 causes reset of the bi-stable element-like behavior of the sense amplifier by equalizing nodes FSA and $FSA_b$, at or near edge 828, to around ground or ≈0 mV, for example. Thereafter, the sensing circuit and its control signals are in a state as shown in stand-by mode 802.

Although FIG. 7 shows a single TCCT based memory cell 702, alternate embodiments of the invention can include a plurality of bit lines 710 coupled to one or more memory cells 702 arranged, for instance, in parallel rows. That is, a number of memory cells 702 can be duplicated over one or more bit lines coupled together to provide a data signal from at least one of many TCCT-based memory cells, for example.

Moreover, although FIG. 7 shows a single reference memory cell 752 coupled to a single bit line, it is within the scope and spirit of the present invention to include any number of reference bit lines each having any number of reference cells coupled thereto. Reference cell 752 in any exemplary memory array can be on a dedicated reference bit line, or several reference cells 752 can be distributed around a memory array such that at least some bit lines are common to both TCCT based memory cells 702 and reference cells 752. Furthermore, although FIG. 7 shows reference cell 752 includes a pull-down transistor M11, in still other embodiments of the present invention, only one pull-down transistor M11 need be coupled to a reference bit line that is coupled to more than one reference cell. In such an embodiment, pull-down transistor M11 is activated whenever one of an associated reference cell is selected to provide a reference signal by a separate RWL1 signal than controls device M12.

Figure 9:
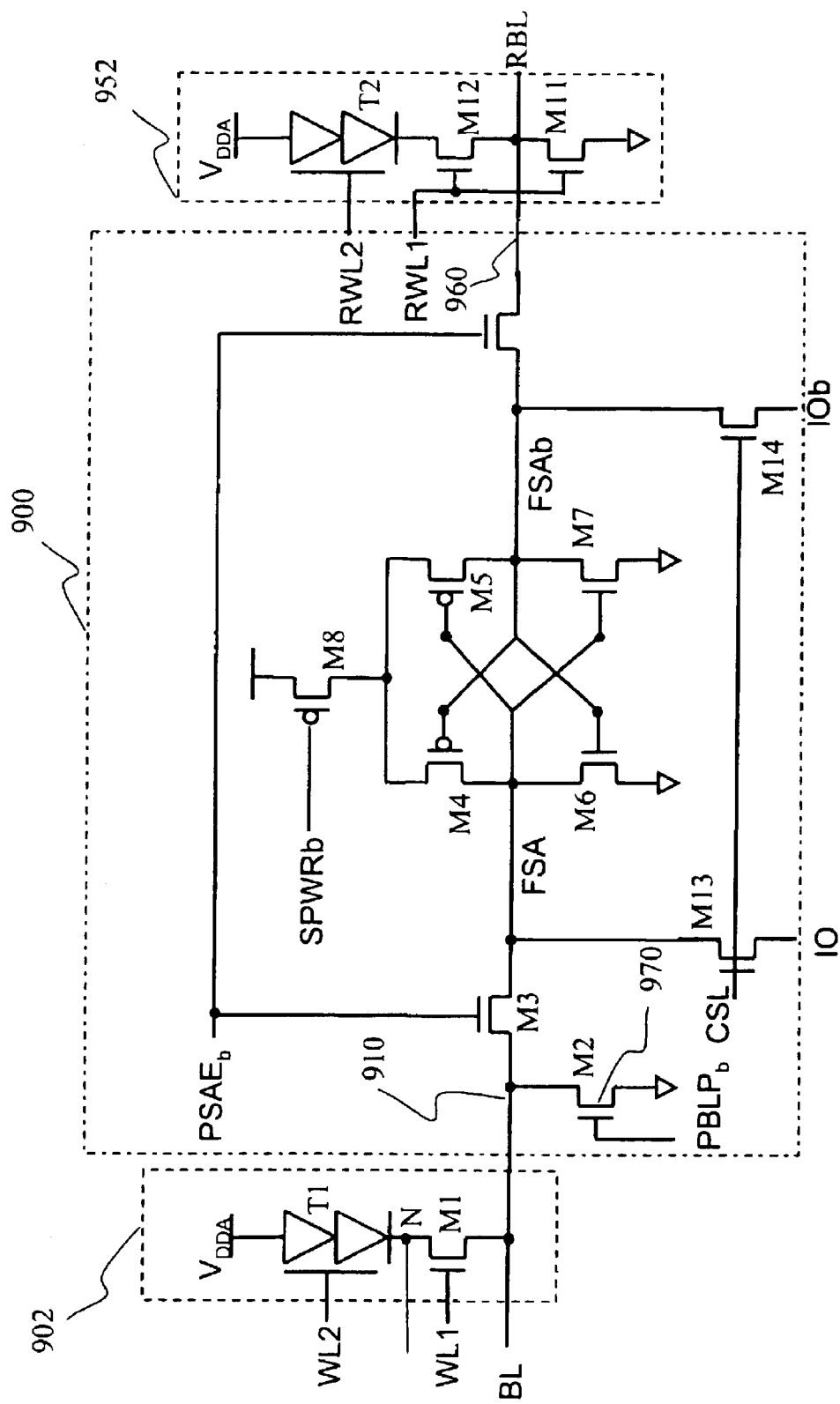
FIG. 9 is a schematic representation of an exemplary sensing circuit in accordance with yet another embodiment of the present invention.
Figure 11:
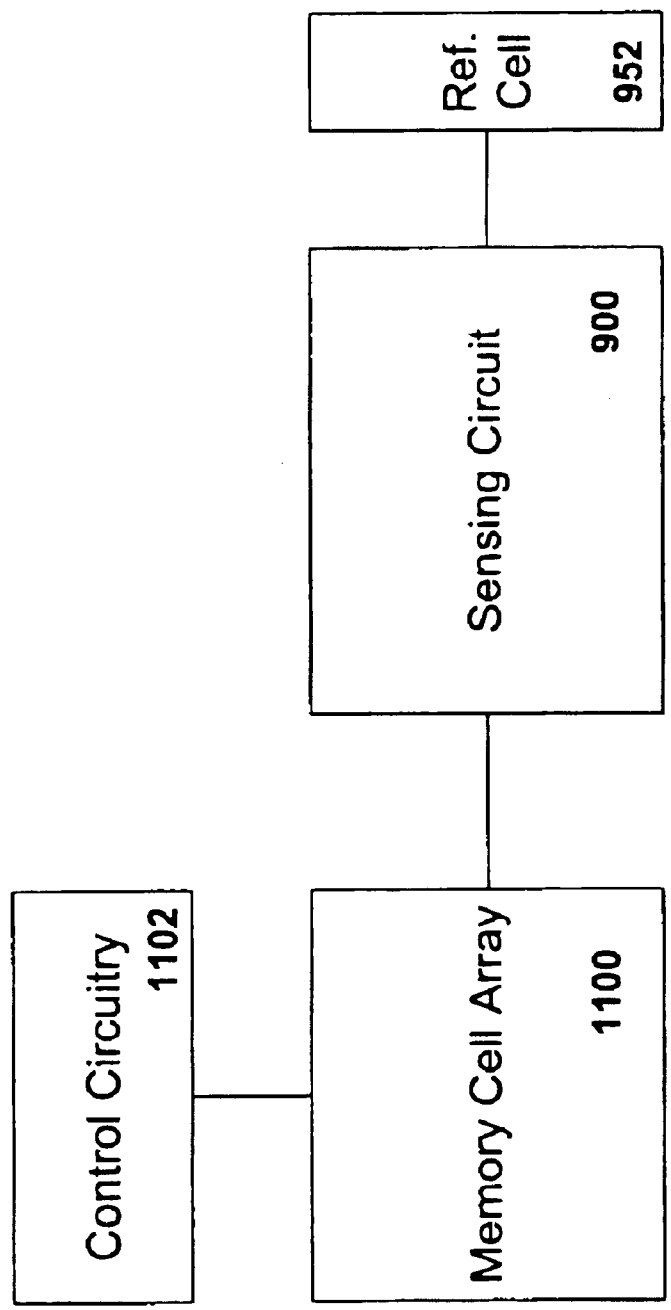
FIG. 11 is a block diagram of an exemplary sensing circuit of the present invention coupled to a memory cell array and associated control circuitry.

FIG. 9 shows an exemplary sensing circuit 900 in accordance with another specific embodiment of the present invention. In this example, memory cell 902 and reference cell 952 are similar in function and structure to memory cell 402 and reference cell 452 of FIG. 4, respectively. The individual circuit elements of sensing circuit 900 of FIG. 9 are similar in structure and functionality to the individual circuit elements of sensing circuit 400 of FIG. 4, with the exception that pre-charge device M10 472 is absent. Removing the optional pre-charge device M10 472 serves to save space, allowing for a greater number of memory cells 902 per unit area of a chip. It will be appreciated that although only a single memory cell 902 is shown in FIG. 9, that memory cell 902 can be readily replaced by an array of memory cells 902 and the control circuitry necessary to select an individual memory cell 902 and couple it to the bit line 910. FIG. 11 is a block diagram illustrating the substitution of a memory cell array 1100 of a plurality of memory cells for the memory cell 902 in FIG. 9. To select a particular memory cell of the memory cell array 1100 requires the use of control circuitry 1102 such as row and column decoders.

Because the embodiment shown in FIG. 9 functions without pre-charge device M10 472 a timing diagram like the one shown in FIG. 6 for this embodiment would differ from that in FIG. 6 only on the representation of the charge level on the node $FSA_b$. In FIG. 6 the voltage level on node $FSA_b$ is brought to approximately ground by pre-charge device M10 472 after each read operation. However, in the embodiment shown in FIG. 9, after a read operation is completed and before the next read operation commences the charge on node $FSA_b$ remains essentially unchanged from the level achieved at the end of the just completed read operation. More specifically, after a read operation reference cell 952 decouples from the sense amplifier when M9 turns off (i.e. stops conducting). Additionally, when in a non-read mode, control signal RW1 is in a state (e.g., low) that devices M11 and M12 deactivate. When M11 and M12 deactivate (i.e,. turn off), a conductive path to ground is removed and excess charge cannot dissipate. Thereafter, RBL 960 floats, at least initially, at a potential equivalent to the last logical value sensed at node $FSA_b$.

Once a new read operation is started, the charge on node $FSA_b$ is adjusted to a reference voltage determined by the transistors M11 and M12, as described above. In the event, for example, that a logical "0" is read from memory cell 902 and node FSA goes to approximately ground and node $FSA_b$ goes to a complementary high level, the charge on node $FSA_b$ will remain at approximately the high level until the next read operation begins. At the start of the next read operation the voltage will be drawn down to the reference voltage. In sum, during read mode, RBL 960 is at approximately $V_{REF}$ and during non-read mode RBL 960 is floating at a voltage representing an in determinant logical value.

Figure 10:
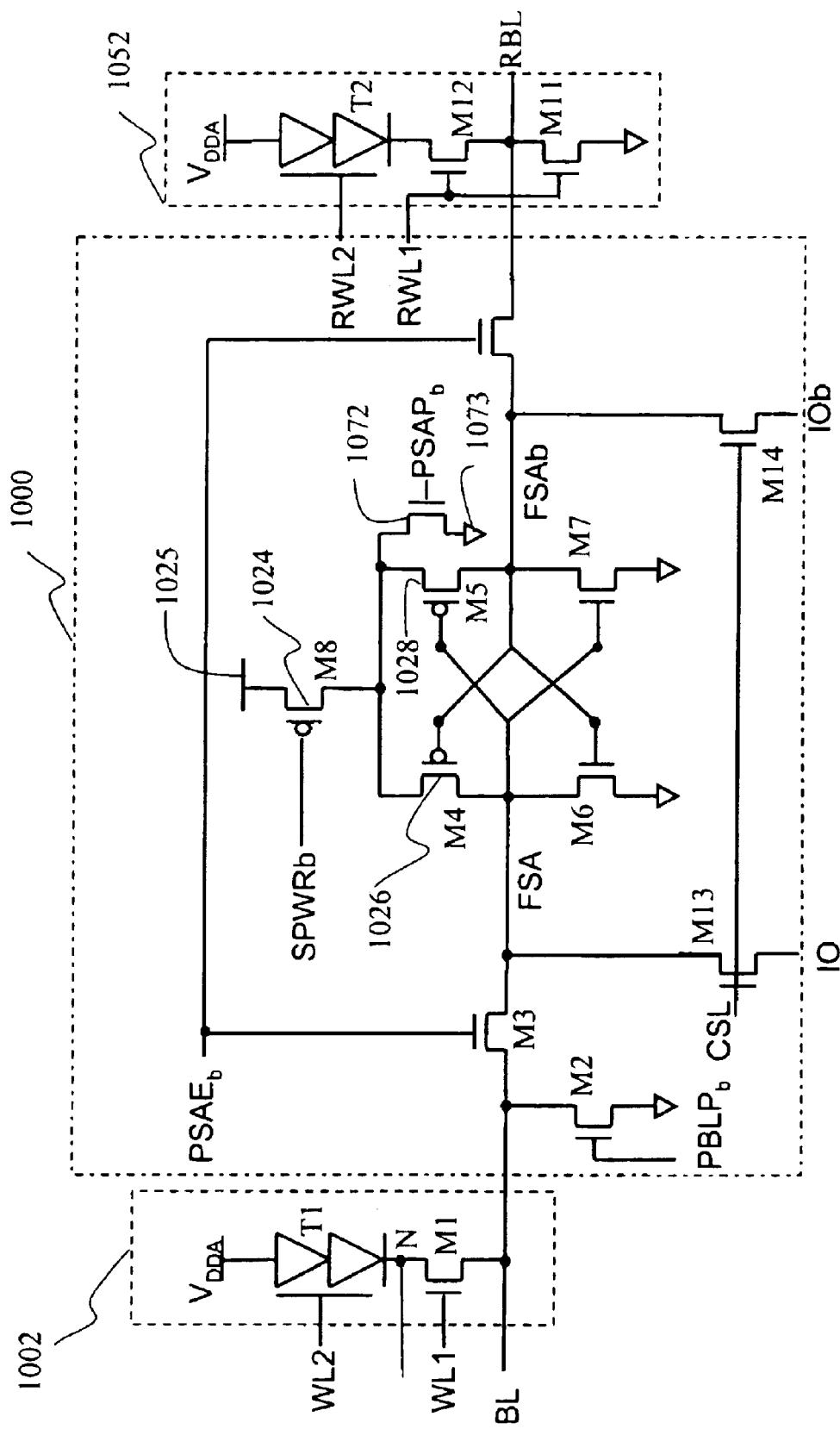
FIG. 10 is a schematic representation of an exemplary sensing circuit in accordance with still yet another embodiment of the present invention.

FIG. 10 shows can exemplary sensing circuit 1000 in accordance with another specific embodiment of the present invention. In the example, memory cell 1002 and reference cell 1052 are similar in function and structure to memory cell 902 and reference cell 952 of FIG. 9, respectively, and the individual circuit elements of sensing circuit 1000 are similar in structure and functionality to the individual circuit elements of sensing circuit 900 of FIG. 9. Sensing circuit 1000 further includes a sense amplifier pre-charge device 1072 coupled to a PMOS source node that couples together PMOS device M4 1026 and PMOS device M5 1028 at their respective source terminals. The sense amplifier pre-charge device 1072 is also coupled to a voltage source 1073 having a substantially constant potential such as ground.

In this example, sensing circuit 1000 includes a voltage source 1025 having a substantially constant potential, such as $V_{DD}$ (a peripheral power that can be different from the array power, $V_{DDA}$), coupled to the PMOS source node by a switchable device M8 1024. A control signal $SPWR_b$ is used to switch states of the device M8 1024 to either apply or remove a voltage produced by the voltage source 1025. However, in some embodiments when device 8 1024 is set to isolate the PMOS source node from the voltage source 1025 (i.e., $SPWR_b$ is in a low state) a certain amount of current will still leak through to reach the PMOS source node. In these embodiments the sense amplifier pre-charge device 1072 provides a mechanism to remove excess charge from the PMOS source node due to the leakage current.

In further embodiments a control signal PSAP$_b$ is used to switch states of the sense amplifier pre-charge device 1072 to either apply or remove a voltage produced by the voltage source 1073. It will be appreciated that control signal PSAP$_b$ should operate in conjunction with control signal SPWR$_b$ such that when device M8 1024 is enabled to couple the voltage source 1025 to the PMOS source node, the sense amplifier pre-charge device 1072 is deactiviated (i.e., turned off) to isolate the voltage source 1073 from the PMOS source node. Referring to the timing diagram of FIG. 6, the control signal SPWR$_b$ should also be used to isolate the voltage source 1073 from the PMOS source node during the period from about edge 606 to edge 614 to prevent the data and reference signals being applied to the nodes of the sense amplifier from being drained away.

Although the present invention has been discussed with respect to specific embodiments, one of ordinary skill in the art will realize that these embodiments are merely illustrative, and not restrictive, of the invention. For example, although the above description describes an exemplary memory cell as a TCCT-based memory cell, it should be understood that the present invention relates to any memory cell type in general and need not be restricted to use in TCCT memory arrays. For example, Magnetoresistive Random Access Memory ("MRAM"), Ferroelectric Random Access Memory ("FRAM"), SRAM, DRAM, and other memory types can be deployed in the architecture described herein or modified to accommodate the specific memory type. Furthermore, any memory type can provide a basic structure for a reference memory cell in which a memory cell is compared thereto. Moreover, another example of the disclosed circuit and method can substitute each NMOS semiconductor with a PMOS device, and visa versa. The scope of the invention is to be determined solely by the appended claims.

What is claimed is:

1. A sensing circuit including a sense amplifier to resolve a data signal generated by a TCCT-based memory cell, the sensing circuit comprising:
    a bit line coupled to the TCCT-based memory cell to receive the data signal;
    a first pre-charge device coupled to the bit line and configured to pre-charge the bit line;
    a reference bit line configured to receive a reference signal from a reference memory cell; and
    a second pre-charge device coupled to the reference bit line and configured to pre-charge the reference bit line.

2. The sensing circuit of claim 1, further comprising a first node connected to a first input of the sense amplifier, the first node configured to couple with the bit line.

3. The sensing circuit of claim 2, further comprising a first switchable device to temporally couple the first node to the bit line.

4. The sensing circuit of claim 3, wherein the first switchable device is a MOSFET device.

5. The sensing circuit of claim 1, wherein the first pre-charge device includes a second switchable device to couple the bit line to a pre-charge node, where the pre-charge node is at least one pre-determined level.

6. The sensing circuit of claim 5, wherein the at least one pre-determined level is a potential equivalent to ground.

7. The sensing circuit of claim 5, wherein the second switchable device is a MOSFET device.

8. The sensing circuit of claim 1, wherein the sense amplifier comprises two cross-coupled inverters.

9. The sensing circuit of claim 8, further comprising a sensing power switchable device coupled between the sense amplifier and another potential to enable operation of the sense amplifier.

10. The sensing circuit of claim 1, further comprising:
    a second node connected to a second input of the sense amplifier, the second node configured to couple with the reference bit line.

11. The sensing circuit of claim 1, wherein the reference memory cell includes a TCCT device cell.

12. The sensing circuit of claim 10, further comprising a third switchable device to temporally couple the second node to the reference bit line.

13. The sensing circuit of claim 12, wherein the third switchable device is a MOSFET device.

14. The sensing circuit of claim 1, wherein the second pre-charge device includes a fourth switchable device to couple the reference bit line to a reference pre-charge node, where the reference pre-charge node is at least one pre-determined reference level.

15. The sensing circuit of claim 14, wherein the at least one pre-determined reference level is equivalent to the at least one pre-determined level.

16. The sensing circuit of claim 14, wherein the fourth switchable device is a MOSFET device.

17. The sensing circuit of claim 10, further comprising a fifth and a sixth switchable device configured to communicate complementary signals from the first and the second nodes, respectively.

18. A sensing circuit including a sense amplifier to resolve a data signal generated by a memory cell, the sensing circuit comprising:
    a bit line coupled to the memory cell to receive the data signal;
    a first node connected to a first input of the sense amplifier, the first node configured to couple with the bit line;
    a first pre-charge device coupled to the bit line to pre-charge the bit line to a first pre-determined level; and
    a second pre-charge device coupled to the first node to pre-charge the bit line to a second pre-determined level.

19. The sensing circuit of claim 18, wherein the memory cell is a TCCT-based memory cell.

20. The sensing circuit of claim 18, further comprising a first MOSFET device to couple the first node to the bit line.

21. The sensing circuit of claim 18, wherein the first pre-charge device includes a second MOSFET device to couple the bit line to a first pre-charge node, where the first pre-charge node is at the first pre-determined level.

22. The sensing circuit of claim 21, wherein the first pre-determined level is a potential equivalent to ground.

23. The sensing circuit of claim 18, wherein the second pre-charge device includes a third MOSFET device to couple the first node to a second pre-charge node, where the second pre-charge node is at the second pre-determined level.

24. The sensing circuit of claim 23, wherein the second pre-determined level is a potential equivalent to ground.

25. The sensing circuit of claim 18, wherein the sense amplifier comprises two cross-coupled inverters.

26. The sensing circuit of claim 25, further comprising a sensing power MOSFET device coupled between the sense amplifier and another potential to enable operation of the sense amplifier.

27. The sensing circuit of claim 18, wherein the sense amplifier is configured to receive a reference signal generated by a reference memory cell, the sensing circuit further comprising:
    a reference bit line coupled to the reference memory cell to receive the data signal;
    a second node connected to a second input of the sense amplifier, the second node configured to couple with the reference bit line;
    a third pre-charge device coupled to the reference bit line to pre-charge the reference bit line to a third pre-determined level; and a fourth pre-charge device coupled to the second node to pre-charge the bit line to a fourth pre-determined level.

28. The sensing circuit of claim 27, wherein the reference memory cell includes a TCCT device.

29. The sensing circuit of claim 27, further comprising a fourth MOSFET device to couple the second node to the reference bit line.

30. The sensing circuit of claim 27, wherein the third pre-charge device includes a fifth MOSFET device to couple the reference bit line to a third pre-charge node, where the third pre-charge node is at the third pre-determined level.

31. The sensing circuit of claim 30, wherein the third pre-determined level is a potential equivalent to ground.

32. The sensing circuit of claim 27, wherein the fourth pre-charge device includes a sixth MOSFET device to couple the second node to a fourth pre-charge node, where the fourth pre-charge node is at the fourth pre-determined level.

33. The sensing circuit of claim 32, wherein the fourth pre-determined level is a potential equivalent to ground.

34. The sensing circuit of claim 27, wherein the sense amplifier comprises two cross-coupled inverters.

35. A method of controlling a sensing circuit, the method comprising:
    coupling a bit line to a first node, the first node associated with a first sense amplifier input;
    pre-charging the bit line to a first pre-determined level;
    pre-charging the first node to the first pre-determined level;
    floating the bit line;
    floating the first node; and
    transferring a data signal from a TCCT-based memory cell onto the bit line.

36. The method of claim 35, further comprising resolving the data signal including:
    applying the data signal from the bit line to the first node;
    decoupling the bit line and the first node; and
    determining a logical value in which the data signal represents.

37. The method of claim 35, further comprising enabling operation of a sense amplifier.

38. The method of claim 35, wherein the coupling of the bit line to the first node is during non-resolving operation of the sense amplifier.

39. The method of claim 35, the method further comprising:
    coupling a reference bit line to a second node, the second node associated with a second sense amplifier input;
    pre-charging the reference bit line to a second pre-determined level;
    pre-charging the second node to the second pre-determined level;
    floating the reference bit line;
    floating the second node; and
    transferring a reference signal from a reference memory cell onto the reference bit line.

40. The method of claim 39, wherein the coupling the reference bit line to the second node is during non-resolving operation of the sense amplifier.

41. The method of claim 39, wherein the reference memory cell includes a TCCT device.

42. The method of claim 39, further comprising using the reference signal including:
    applying the reference signal from the reference bit line to the second node; and
    decoupling the reference bit line and the second node.

43. A method of controlling a sensing circuit, the method comprising:
    floating a bit line;
    pre-charging a first node to a first pre-determined level;
    pre-charging the bit line to a second pre-determined level;
    coupling the bit line to the first node, the first node associated with a first sense amplifier input; and
    floating the first node.

44. A method of controlling a sensing circuit, the method comprising:
    floating a bit line;
    pre-charging a first node to a first pre-determined level;
    pre-charging the bit line to a second pre-determined level;
    coupling the bit line to the first node, the first node associated with a first sense amplifier input; and
    transferring a data signal from a thinly capacitively-coupled thyristor based memory cell onto the bit line.

45. The method of claim 44, further comprising resolving the data signal including:
    applying the data signal from the bit line to the first node;
    decoupling the bit line and the first node; and
    determining a logical value in which the data signal represents.

46. The method of claim 45, further comprising enabling operation of a sense amplifier.

47. A method of controlling a sensing circuit, the method comprising:
    floating a bit line;
    pre-charging a first node to a first pre-determined level;
    pre-charging the bit line to a second pre-determined level; and
    coupling the bit line to the first node, the first node associated with a first sense amplifier input;
    wherein the coupling of the bit line to the first node is approximately near or prior in time to the application of the data signal from the bit line to the first node.

48. A method of controlling a sensing circuit, the method comprising:
    floating a bit line;
    pre-charging a first node to a first pre-determined level;
    pre-charging the bit line to a second pre-determined level;
    coupling the bit line to the first node, the first node associated with a first sense amplifier input;
    floating a reference bit line;
    pre-charging a second node to a third pre-determined level;
    pre-charging the bit line to a fourth pre-determined level; and
    coupling the reference bit line to the second node, the second node associated with a second sense amplifier input.

49. The method of claim 48, further comprising floating the second node.

50. The method of claim 49, further comprising transferring a reference signal from a memory cell onto the bit line.

51. The method of claim 48, wherein the reference memory cell includes a TCCT device.

52. The method of claim 50, further comprising:
    applying the reference signal from the reference bit line to the second node; and
    decoupling the reference bit line and the second node.

53. The method of claim 48, wherein the first, the second, the third and the fourth pre-determined levels are equivalent to ground.

* * * * *